United States Patent [19]

Jason

[11] Patent Number: 4,617,474
[45] Date of Patent: Oct. 14, 1986

[54] SIGNAL DETECTOR

[76] Inventor: Barry L. Jason, 325 Warbler Dr., Bedford, Tex. 76021

[21] Appl. No.: 625,471

[22] Filed: Jun. 27, 1984

[51] Int. Cl.⁴ .......................... H03K 5/00; H03D 1/00
[52] U.S. Cl. ..................................... 307/262; 307/315;
  307/494; 328/26; 328/171; 328/165; 363/127;
  329/166
[58] Field of Search ............... 307/261, 262, 494, 315;
  328/26, 149, 171, 172, 165; 363/127; 329/166,
  101, 192; 381/94; 358/36

[56] References Cited

U.S. PATENT DOCUMENTS

| | | | |
|---|---|---|---|
| 3,596,184 | 7/1971 | Hanus et al. | 325/478 |
| 3,626,294 | 12/1971 | Daney | 325/478 |
| 3,628,058 | 12/1971 | Espe | 307/235 |
| 3,769,592 | 10/1973 | Espe | 325/478 |
| 3,857,047 | 6/1973 | Knight | 307/231 |
| 3,904,969 | 9/1975 | Eastmond | 325/478 |
| 3,958,181 | 5/1976 | Hansen et al. | 325/480 |
| 4,124,819 | 11/1978 | Hansen | 325/479 |
| 4,250,457 | 2/1981 | Hofmann | 329/101 |
| 4,327,446 | 4/1982 | Dressler | 455/223 |
| 4,359,693 | 11/1982 | Sauer | 329/101 |

Primary Examiner—Stanley D. Miller
Assistant Examiner—Richard Roseen
Attorney, Agent, or Firm—Donald B. Southard

[57] ABSTRACT

A detector is disclosed for receiving an AC signal and for generating a DC output signal indicative of the level of the input signal. The detector includes an amplifier receiving the input signal and a first transistor stage which responds to the amplifier output by developing increasing or decreasing levels of current, depending on the polarity of the amplifier's output. Second and third transistors sense those increasing and decreasing current levels for developing two intermediate currents of the same polarity. The intermediate current are coupled to a load across which a fully rectified output signal is developed.

11 Claims, 2 Drawing Figures

SIGNAL DETECTOR

FIELD OF THE INVENTION

This invention is directed to a detector such as may be used in RF (radio frequency) receivers for developing an output signal indicative of the level of a received signal.

BACKGROUND OF THE INVENTION

Detectors of the type under consideration may detect incoming noise or other signals by using diode detector circuits. In such a detector, one or more diodes may be used in a rectifier circuit whose complexity may vary considerably, depending on the application and the specific requirements.

Irrespective of the type of diode detector circuit used, most such circuits have at least two drawbacks: a lack of gain and a diode offset voltage. The latter problem arises from the fact that a diode includes an inherent offset voltage which must be overcome by the incoming signal before useful detection can occur. Consequently, very small signals are difficult to detect in this manner.

Another problem with diode detectors resides in their inherent temperature dependence. As ambient temperature varies, the detected output of the diode can vary consideraly. In many applications such temperature dependent operation is not acceptable.

OBJECTS OF THE INVENTION

It is a general object of the invention to provide an improved signal detector.

It is a more specific object of the invention to provide a signal detector having a controlled gain, virtually no offset voltage and no significant temperature dependence.

It is another object of the invention to provide such a detector which is particularly well suited for detecting noise.

SUMMARY OF THE INVENTION

Broadly stated, the detector disclosed herein includes an amplifier which receives the signal to be detected, and a transistor stage receiving the output of the amplifier for developing in its collector path increasing and decreasing levels of current in response to positive and negative excursions in the signal developed at the output of the amplifier. Second and third transistors respond, respectively, to the increasing and decreasing levels of current in the collector path of the first transistor stage for developing first and second intermediate currents which are of the same polarity.

Output circuitry, preferably in the form of a current mirror, receives both intermediate currents and "mirrors" them to a load, thereby developing across the load a fully rectified version of the input signal applied to the amplifier. Also, the preferred embodiment includes a feedback path coupled between the collector path of the first transistor stage and the input of the amplifier so as to stabilize the operation of the detector.

DESCRIPTION OF THE PREFERRED EMBODIMENT

Figure 1:
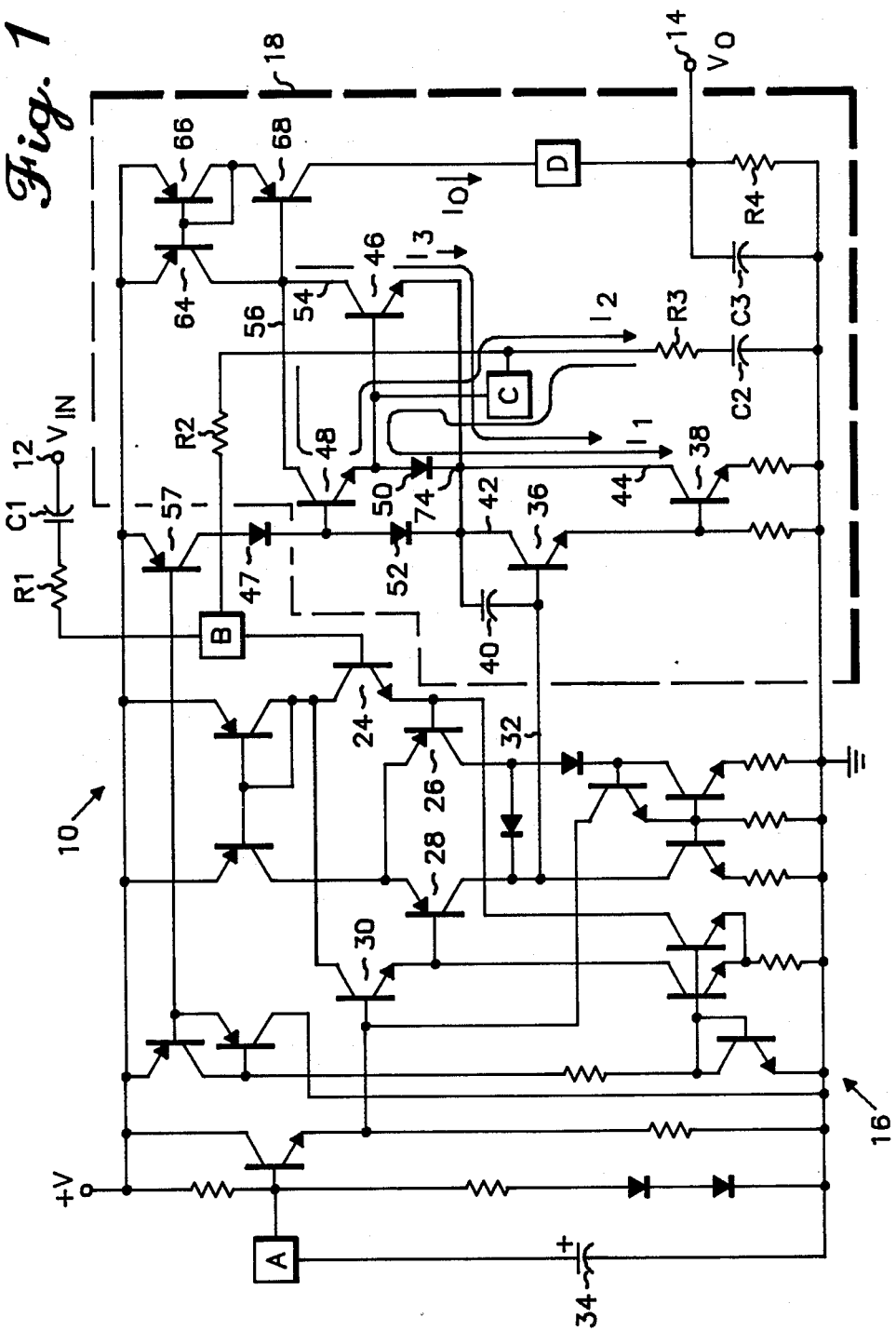
FIG. 1 is a schematic diagram of a signal detector according to the invention.

Referring to FIG. 1, an AC signal detector is shown which is preferably used to detect the level of noise in an audio signal and to generate a DC signal representative of the detected noise level. Of course, signals other than noise (audio, for example) may also be advantageously detected by this signal detector. However, as the illustrated embodiment has been sepcifically designed to detect noise, the description which follows is based on the assumption that the detector is receiving and detecting noise.

In a typical application, a radio receiver includes an audio detector (not shown) whose output is band-pass filtered to remove the audio. The remaining noise is coupled to this detector's input terminal 12. The positive and negative excursions of the noise are full-wave rectified to generate, at an output terminal 14, a DC output signal representative of the level of the received noise. That output signal may then be used to control the operation of an audio squelch circuit (not shown) in the radio receiver.

For purposes of explanation, the detector 10 may be considered as comprising two sections, an amplifier section 16 and a rectifier section 18. Both sections have been designed to be constructed in integrated circuit form. Hence, pads A, B, C, and D are included for accessing internal points in the integrated circuit.

In the illustrated embodiment, input signals to the detector 10 are coupled from the input terminal 12 to the pad B via an external blocking capacitor $C_1$ and a resistor $R_1$. As is explained later, the value of the resistor $R_1$ is one of the factors which can be used to select the desired gain of the detector.

The illustrated amplifier section between the pad B and the input to the rectifier section essentially comprises an input stage of a conventional operational amplifier and will, therefore, not be described in detail. Suffice it to say that the signal at pad B is coupled to a differential amplifier stage comprising transistors 24, 26, 28 and 30, the output of which is coupled via a lead 32 to the input of the rectifier section 18. Those skilled in the art will recognize that the other illustrated components in the amplifier section 16 serve to provide the suitable bias currents, stabilization, etc. which are found in conventional operational amplifiers. Also conventional is the use of an AC bypass capacitor 34 for grounding the pad A.

Referring now to the rectifier section of the detector, it can be broadly considered as having three functional parts. The first part includes transistors 36 and 38 which are coupled together as a Darlington stage. These transistors can be considered functionally as a single transistor which responds to the positive and negative excursions of the signal on lead 32 for developing increasing and decreasing levels of current which are sensed by the second part of the rectifier. The current level from which the current is being increased or decreased is that current level set by the quiescent biasing current generated in the amplifier section and flowing through diode 47, from the collector of transistor 57. As indicated, the transistor 36 may include a small (10 P.F.) capacitor between its collector and base to prevent oscillations.

The currents developed by transistors 36 and 38 are carried via their collector path (leads 42 and 44) to the second part of the rectifier which includes transistors 46 and 48 and diodes 50 and 52. As is explained more fully below, the transistors 46 and 48 sense the increasing and decreasing levels of current developed in the previously mentioned collector path (leads 42 and 44) for developing, in collector leads 54 and 56, currents which are referred to herein as intermediate currents.

Before discussing how the intermediate currents are processed, it should be noted that the emitter of the transistor 48 is coupled to the base of the transistor 46 so that the base-emitter junctions of these transistors are coupled in series with each other. The diode 52 is coupled in parallel with the serially connected base emitter junctions for the purpose of limiting the voltage thereacross to one diode drop. Consequently, only one of the transistors 46, 48 can conduct heavily at any given time. Bias current for the diode 52 is received from a diode 47 and a transistor 57 in the amplifier section 16.

Note also that the diode 50 is coupled in series with the collector path which comprises leads 42 and 44, and is coupled in parallel with the base-emitter junction of the transistor 46. In practice, the diode 50 is a transistor whose collector is coupled to its base so that the current it carries passes through a base-emitter junction which is very similar to the base-emitter junction of the transistor 46. Consequently, the current which is conducted by the diode 50 is accompanied by a voltage across the base-emitter junction of transistor 46, which voltage causes the transistor 46 to conduct a current which is nearly identical to the current conducted by the diode 50.

In this embodiment, the base of the transistor 46 is brought out to the pad C from which an external RC filter, comprising a resistor $R_3$ and a capacitor $C_2$, may be coupled to ground. Also, a feedback path which may include an external resistor $R_2$ is coupled from pad C to pad B for controlling the detector's gain.

The final part of the detector may include any suitable means for coupling the intermediate currents to a load. In the preferred embodiment, this includes an output stage in the form of a current mirror which receives the intermediate currents developed by the transistors 46 and 48. The illustrated current mirror includes PNP transistors 64, 66, and 68 interconnected as shown to receive the currents from leads 54 and 56 and to "mirror" those currents into a load coupled to the pad D. In this case, the load includes a resistor $R_4$ in parallel with a capacitor $C_3$ which filters the output signal.

The operation of the detector 10 will now be described by first assuming that a noise signal applied to the input terminal 12 is undergoing a positive excursion (i.e., its amplitude is increasing in a positive direction). This positive-going signal becomes coupled to the base of the transistors 24 via the capacitor $C_1$ and the resistor $R_1$. The potential at the emitter of this transistor now rises, which results in a decrease in conduction by the transistor 26. Consequently, the transistor 28 conducts harder (because of the differential configuration) and produces a positive-going signal on the lead 32.

In the rectifier section, the bases of the transistors 36 and 38 are driven positive by the positive-going signal on the lead 32. This positive-going signal results in an increasing level of current being developed in leads 42 and 44 so that the voltage at the common collector junction (node 74) is pulled negative. The effect of this action is the development of a current $I_1$ which flows in the indicated direction through the capacitor $C_2$ and the resistor $R_3$ to pad C, and then through the diode 50 and the collector path of transistors 36 and 38. (Actually, a small amount of the current through the resistor $R_3$ flows through the feedback resistor $R_2$ into the base of the transistor 24.) In response to the current through the diode 50, the transistor 46 develops in the lead 54 an intermediate current $I_3$ whose value is nearly identical to the current $I_1$. That intermediate current is received by the transistor 64 and is mirrored to the pad D as an output current $I_o$.

Note that the transistor 48 was held off or at a very low level of conduction while the transistor 46 conducted relatively hard.

Consider now the case when the input signal at the terminal 12 undergoes a negative excursion. This causes the voltage of the emitter of the transistor 24 to decrease, causing the transistor 26 to conduct harder. Consequently, the conduction of transistor 28 decreases and drives the potential on lead 32 in a negative direction.

In response to driving the potential on lead 32 in a negative direction, the transistors 36 and 38 develop a decreasing level of current which causes the potential at the node 74 to rise. This, in turn, causes the transistor 46 to turn off and the transistor 48 to turn on. Consequently, the transistor 48 supplies a current shown as $I_2$ which flows to the pad C and through the resistor $R_3$ and the capacitor $C_2$. (Some current also flows through the feedback resistor $R_2$ into the base of the transistor 24.)

The current thus developed by the transistor 48 is sensed by the transistor 64 and is mirrored to the output pad D as $I_o$. Thus, for positive and negative excursions of the signal input at the terminal 12, a unipolar output current $I_o$ is supplied to the detector's load. In other words, the input signal has undergone full-wave rectification.

A number of advantages arise from this type of detection. First, there is no offset voltage which must be overcome by the input signal. Even very small input signals are rectified because the amplifier section 16 is biased to amplify very small signals, and the rectifier section 18 provides rectified currents for all its signal inputs. There are no diode drops to overcome in either section of the detector.

A second advantage of this detector is that its operation is substantially insensitive to changes in the ambient temperature. This is due primarily to the feedback which has the effect of rendering the detector insensitive to factors such as temperature variations which could otherwise alter the detector's gain.

Another useful advantage of this detector is that it can provide gain, whereas the typical diode detector cannot. Moreover, the gain of the detector 10 can be set by external components so that gain adjustment is a relatively easy and inexpensive matter. This is illustrated by the following equation for the gain of the detector 10:

$$\frac{V_o}{V_{in}} = \frac{SC_1 R_4 X}{1 + R_1 SC_1} (1 + R_2/R_3)$$

At most frequencies of interest, the magnitude of $R_1 SC_1$ will be much larger than 1, with the result that the "$SC_1$" terms drop out of the forgoing equation and the gain of the detector becomes a function of the values of the external resistors $R_1$, $R_2$, $R_3$ and $R_4$. Hence, the gain of this detector is easily controlled by the selection of the external resistors.

Figure 2:
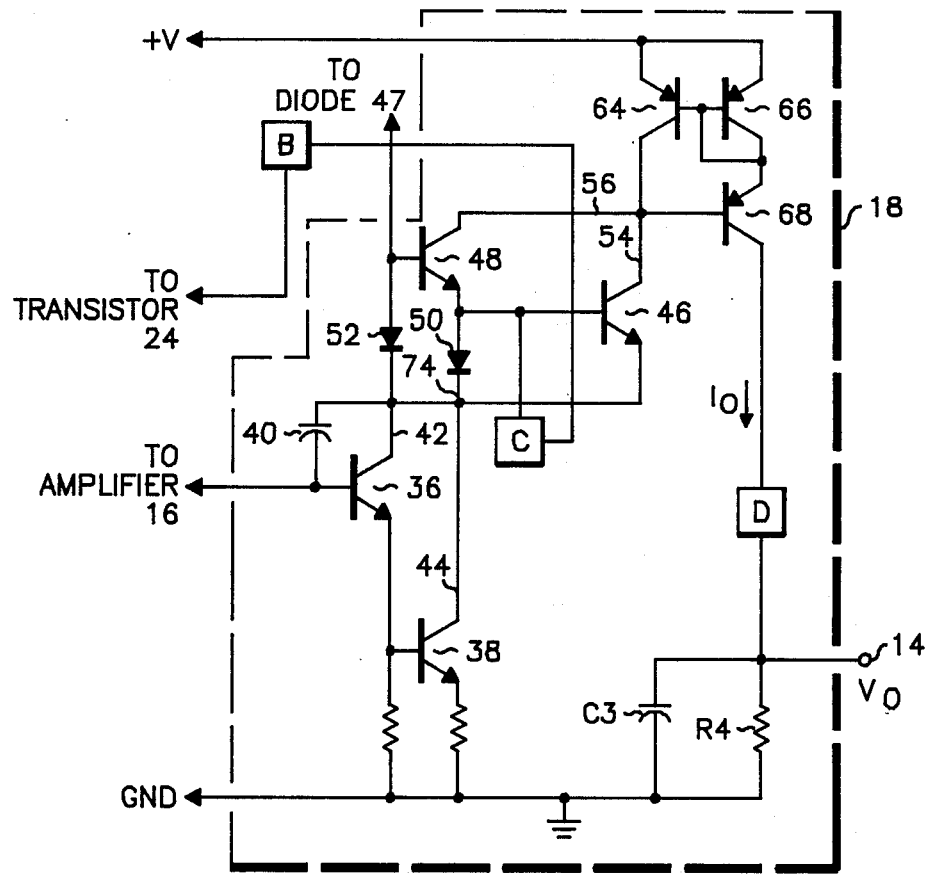
FIG. 2 shows alternate embodiment of the full-wave rectifier which forms part of the detector illustrated in FIG. 1.

For some applications, it may be desireable to reduce the number of external components which are used with the detector 10. The foregoing equation reveals what can be removed. For example, if $R_2$ is set equal to zero in the equation, or if the value of $R_3$ is set at infinity, the gain of the detector drops somewhat, but it still develops an output which is proportional to $R_4/R_1$. This, in fact, is what is done in the embodiment of the rectifier shown in FIG. 2, to which reference is now made.

As shown, the resistor $R_2$ has been replaced by a minimum resistance feedback path (a short circuit between pads B and C), thereby placing these pads at the same potential (virtual ground). Consequently, the resistor $R_3$ and the capacitor $C_2$ have no effect in this embodiment and are, therefore, removed. The pad C may also be eliminated because access to that internal circuit point is no longer needed.

The elimination of the resistors $R_2$ and $R_3$ and the capacitor $C_2$ does not substantially change the manner in which the detector operates. The embodiments of FIGS. 1 and 2 operate similarly to provide the advantages of controllable gain, lack of sensitivity to temperature, and the ability to rectify even small input signals.

Although the invention has been described in terms of specific embodiments, it will be obvious to those skilled in the art that many modifications and alterations may be made without departing from the invention. For example, the output stage may be a different type of current mirror, or it may use something other than a current mirror. Also, the input stage of the amplifier may be modified to suit a particular application. Other obvious modifications may be made as circumstances require. Accordingly, it is intended that all such alterations and modifications be considered as within the spirit and scope of the invention as defined by the appended claims.

What is claimed is:

1. An AC signal detector, comprising:
   an amplifier having an input for receiving signals which undergo positive and negative excursions, and having an output;
   a first transistor coupled to the output of the amplifier and responsive to an output signal excursion of a first polarity for developing an increasing level of current and responsive to a signal excursion of the opposite polarity for developing a decreasing level of current;
   second and third transistors coupled to an output terminal of the first transistor for conducting on opposite polarities of the input signal, said second transistor being responsive to an increasing level of current in the first transistor for developing a first intermediate current, and said third transistor being responsive to a decreasing level of current in the first transistor for developing a second intermediate current having the same polarity as the first intermediate current; and
   means for receiving the first and second intermediate currents and outputting said intermediate currents to a load.

2. A detector as set forth in claim 1 wherein said first transistor includes a collector emitter path carrying said increasing and decreasing levels of current, and further including a feedback path coupling said collector path to the input of the amplifier.

3. A detector as set forth in claim 2 wherein said feedback path is a short circuit feedback path.

4. A noise detector as set forth in claim 2 further including an RC filter serially coupling input signals to the input of said amplifier.

5. A detector as set forth in claim 2 wherein the junction of said feedback path and said collector path is coupled to ground through an RC filter.

6. A detector as set forth in claim 2 wherein said means for receiving the first and second intermediate currents includes a current mirror.

7. A detector as set forth in claim 1 wherein said second and third transistors are bipolar transistors each having a base-emitter junction and having collector-emitter paths carrying said first and second intermediate currents respectively wherein the base-emitter junctions of the second and third transistors are coupled in series with each other, and further including a diode coupled across the series coupling of the base emitter junctions of the second and third transistors to hold one of the said second and third transistors in an off or low conductive state while the other transistor is in a higher conductive state.

8. A detector as set forth in claim 7 wherein said first transistor includes a collector path carrying said increasing and decreasing levels of current, and further including a second diode coupled in series with said collector path and in parallel with the base-emitter junction of said second transistor so that said second transistor is responsive to said increasing and decreasing levels of current in said collector path.

9. A detector, comprising:
   an amplifier having an input for receiving signals which undergo positive and negative excursions, and which has an output;
   a first transistor responsive to signal excursions of a first polarity at the output of the amplifier for developing an increasing level of current in a collector path, and responsive to signal excursions of an opposite polarity at the output of the amplifier for developing a decreasing level of current in the collector path;
   a first diode coupled in series with said collector path;
   a second transistor having a base-emitter junction coupled in parallel with the first diode and responsive to an increasing level of current in said diode for developing in its collector a corresponding intermediate current;
   a third transistor coupled to the collector path of the first transistor and responsive to a decreasing level of current therein for developing in its collector another intermediate current;
   a feedback path coupling said collector path to the input of the amplifier; and
   a current mirror having an input, receiving both intermediate currents for developing a unipolar output current.

10. A detector as set forth in claim 9 wherein the collectors of the second and third transistors are coupled together and connected to the input of the current mirror.

11. A detector as set foth in claim 10 wherein the base-emitter junctions of the second and third transistors are connected in series with each other, and further including a second diode coupled across the series coupling of the base-emitter junctions of the second and third transistors to permit but one of said junctions to conduct heavily at a given time.

* * * * *